(12) United States Patent
Lu et al.

(10) Patent No.: US 10,969,274 B2
(45) Date of Patent: Apr. 6, 2021

(54) METHOD FOR DETECTING WAVEFRONT ABERRATION FOR OPTICAL IMAGING SYSTEM BASED ON GRATING SHEARING INTERFEROMETER

(71) Applicant: Shanghai Institute of Optics And Fine Mechanics, Chinese Academy of Sciences, Shanghai (CN)

(72) Inventors: Yunjun Lu, Shanghai (CN); Feng Tang, Shanghai (CN); Xiangzhao Wang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 16/685,159

(22) Filed: Nov. 15, 2019

(65) Prior Publication Data

US 2020/0292384 A1    Sep. 17, 2020

(30) Foreign Application Priority Data

Mar. 12, 2019    (CN) .......................... 201910183242.1

(51) Int. Cl.
*G01B 9/02*    (2006.01)
*G01J 3/02*    (2006.01)
(Continued)

(52) U.S. Cl.
CPC .............. *G01J 3/0202* (2013.01); *G01J 3/10* (2013.01); *G01J 3/18* (2013.01)

(58) Field of Classification Search
CPC ............ G01B 2290/30; G01B 9/02098; G01B 11/162; G01J 9/0215; G01J 2009/0219;
(Continued)

(56) References Cited

U.S. PATENT DOCUMENTS

2005/0007602 A1* 1/2005 Haidner ................... G01J 9/04
356/521
2015/0160073 A1* 6/2015 Otaki ...................... G03F 7/706
356/520

FOREIGN PATENT DOCUMENTS

CN        104111120 A    10/2014

OTHER PUBLICATIONS

U.S. Appl. No. 16/684,990, Lu, Yunjun et al., filed Nov. 15, 2019.
(Continued)

*Primary Examiner* — Tarifur R Chowdhury
*Assistant Examiner* — Jonathon Cook
(74) *Attorney, Agent, or Firm* — Mei & Mark LLP; Manni Li

(57) ABSTRACT

Method for detecting wavefront aberration for optical imaging system based on grating shearing interferometer, the grating shearing interferometer system comprising a light source and illumination system, an optical imaging system to be tested, a one-dimensional diffraction grating plate, a two-dimensional diffraction grating plate, a two-dimensional photoelectric sensor, and a computing unit. The one-dimensional and two-dimensional diffraction grating plates are respectively placed on the object plane and the image plane of the optical imaging system to be tested. By collecting interferograms with phase-shifting amounts of 0, π/2, π, 3π/2 and N sets of α, π-α, 2π-α (where, $$N = 2\left(\text{fix}\left(\frac{\text{ceil}(1/s)}{2}\right) + 1\right),$$

s is the shear ratio of the grating shearing interferometer system), combined with a certain phase retrieval algorithm, the influence of all high-order diffraction beams on the phase
(Continued)

retrieval accuracy is eliminated, and finally the detection accuracy of wavefront aberration for the imaging system to be tested is improved.

3 Claims, 3 Drawing Sheets

(51) Int. Cl.
   *G01J 3/10*         (2006.01)
   *G01J 3/18*         (2006.01)
(58) Field of Classification Search
   CPC ............. G01M 11/02; G01M 11/0242; G01M 11/0271; G03F 7/706
   See application file for complete search history.

(56) References Cited

OTHER PUBLICATIONS

J. Braat et al., "Improved Ronchi test with extended source," Journal of the Optical Society of America A., vol. 16, No. 1, pp. 131-140 (1999).

Yucong Zhu et al., "Shearing Interferometry for at wavelength wavefront measurement of extreme-ultraviolet lithography projection optics," Japanese Journal of Applied Physics, vol. 42, pp. 5844-5847 (2003).

Yucong Zhu et al., "Method for designing phase-calculation algorithms for two-dimensional grating phase shifting interferometry," Applied Optics, vol. 50, No. 18, pp. 2815-2822 (Jun. 20, 2011).

* cited by examiner

METHOD FOR DETECTING WAVEFRONT ABERRATION FOR OPTICAL IMAGING SYSTEM BASED ON GRATING SHEARING INTERFEROMETER

CROSS-REFERENCE TO RELATED APPLICATION

The subject application claims priority on Chinese patent application no. 201910183242.1 filed on Mar. 12, 2019 in China. The contents and subject matter of the Chinese priority application is incorporated herein by reference.

FIELD OF TECHNOLOGY

The present invention relates to optical measurement, particularly, device and method for detecting wavefront aberration for projection lens of lithography based on grating shearing interferometer or other optical imaging system and the phase retrieval algorithm of the grating shearing interferometer.

BACKGROUND ART

The grating shearing interferometer has advantages of common path, no need for extra ideal reference, high sensitivity, and simple structure. The phase-shifting interferometry is introduced for phase retrieval by moving the grating laterally to acquire a series of interferograms with different phase-shifting amounts, and then obtaining the wavefront aberration of the system under test.

For shearing interferometer, high-precision phase retrieval is the promise for high-precision detection of the wavefront aberration.

Unlike the two-beam interferometry, there are multistage high-order diffraction beams and interference can occur between the high-order diffraction beams in the interference field of the shearing interferometer due to the diffraction of the grating at the object plane. Although the coherence of the light source is modulated by using an incoherent light source and a grating at the object plane, the interference between the high-order diffraction beams is suppressed, and the interference field is simplified to some extent. However, interference between the high-order other than ±1st-order beams and 0th-order beam still exists on the receiving surface of the detector, which seriously reduces phase retrieval precision.

J. Braat et al., "Improved Ronchi test with extended source," Journal of the Optical Society of America, A, Vol. 16, No. 1, pp: 131-140 (1999) proposes a grating shearing interferometer improved by an extended light source, which uses only the interference between ±1st- and 0th-order diffraction beams for phase retrieval without considering the influence of high-order diffraction beams. As the numerical aperture of the optical system to be tested continues to increase, there are more and more high-order diffraction beams in the system. When the method is used for phase retrieval, a large number of system errors is introduced, which seriously reduces the phase retrieval accuracy.

Yucong Zhu et al., "Shearing Interferometry for at wavelength wavefront measurement of extreme-ultraviolet lithography projection optics," Jpn. J. Appl. Phys., 42, pp. 5844-5847 (2003) discloses filtering high-order diffraction beams by using a double-window mask to ensure that only 1st- and 0th-order beams participate in the two-beam interference. The disadvantage of the method is that when the shear direction or the shear ratio is changed, the mask filter needs to be replaced synchronously, resulting in inconvenient measurement operation and increase in the complexity of the mechanical structure.

Both Yucong Zhu et al., "Method for designing phase-calculation algorithms for two-dimensional grating phase shifting interferometry," Applied Optics, 50(18): pp. 2815-2822 (2011) and Chinese invention patent 201410360070.8 to Feibin Wu et al. use interference between ±1st- and 0th-order diffraction beams for phase retrieval. The commonality of the two is that the phase retrieval accuracy is improved to some extent by eliminating the influence of ±3th- and ±5th-order diffraction beams on the phase retrieval through a certain phase retrieval algorithm. However, for the presence of ±7th- and higher-order diffraction beams, the method still cannot eliminate the effects of these high-order diffraction beams.

For measurement system of shearing interferometer with large numerical aperture, there is no grating shearing interferometer system without high-order diffraction beams which is simple in structure and convenient to operate, and there is also no phase retrieval algorithm and method for eliminating high-order diffraction beams of ±7th-order and above.

SUMMARY OF THE INVENTION

The present invention aims to overcome the disadvantages of the current technology and to provide a method that can eliminate the influence of all high-order diffraction beams in the grating shearing interferometer system except the ±1st-order diffraction beams and completely eliminate the system error in phase retrieval process. The method of the present invention can determine the required phase-shifting step number according to the numerical aperture of the optical system to be tested or the shear ratio of the shearing interferometer system, and has the characteristics of high phase retrieval precision, large measurable range of numerical aperture, and adjustable shear ratio of the grating interferometer.

To achieve the above object, the technical solution of the present invention is as follows:

A method for detecting wavefront aberration for optical imaging system based on grating shearing interferometer, the grating shearing interferometer system used by the method comprising: a light source and illumination system, a one-dimensional diffraction grating plate, a first three-dimensional stage, a two-dimensional diffraction grating plate, a second three-dimensional stage, a two-dimensional photoelectric sensor and a computing unit. The light source and the illumination system output spatially incoherent light, the one-dimensional diffraction grating plate is fixed on the first three-dimensional stage, the two-dimensional diffraction grating plate is fixed on the second three-dimensional stage, the one-dimensional diffraction grating plate comprises two sets of linear gratings with 50% duty-cycle, the two-dimensional diffraction grating plate comprises a set of checkerboard grating, and the two-dimensional photoelectric sensor is connected with the computing unit; establish xyz coordinate, where, the Z axis direction of the coordinate is along the optical axis direction of the system, the X axis direction of the coordinate is along the grating line direction of the linear grating 102 on the one-dimensional diffraction grating plate, the Y axis direction of the coordinate is along the grating line direction of the linear grating 101 on the one-dimensional diffraction grating plate, and set the motion axes of the first three-dimensional stage and the second three-dimensional stage as X axis, Y axis and Z axis respectively; the method includes the following steps:

(1) The optical imaging system to be tested is placed in the grating shearing interferometer, the light source and the illumination system are located on the object side of the optical imaging system to be tested, and the two-dimensional diffraction grating plate is located on the image side of the optical imaging system to be tested; the first three-dimensional stage is adjusted so that the one-dimensional diffraction grating plate is located on the object plane of the imaging system to be tested; the second three-dimensional stage is adjusted so that the two-dimensional diffraction grating plate is located on the image plane of the imaging system to be tested;

(2) The phase-shifting amounts are determined according to the shear ratio s of the grating shearing interferometer: first, the maximum diffraction order is determined as $$m = \text{ceil}\left(\frac{1}{s}\right) - 1,$$

and the diffraction orders of the grating shearing interferometer system are in turn as follows: $\pm 1, \pm 3, \ldots, \pm(2n-1)$, where $$n = \text{fix}\left(\frac{m+1}{2}\right),$$

the function ceil(X) returns the smallest integer greater than or equal to X, and the function fix(X) returns the biggest integer less than or equal to X; then, according to n, a movement of the two-dimensional diffraction grating plate when the interferogram is acquired is respectively determined as 0, ¼, ½, ¾ and $$\frac{\alpha_i}{2\pi}, \frac{\pi - \alpha_i}{2\pi}, \frac{2\pi - \alpha_i}{2\pi}$$

checkerboard grating period (where $$i = 2, 3 \ldots n, \alpha_i < \pi \text{ and } \alpha_i \neq \frac{\pi}{2});$$

(3) The first three-dimensional stage is moved so that the first grating along the Y axis direction of the grating line on the one-dimensional grating diffraction plate is moved to the position of object side field of the optical imaging system to be tested; the second three-dimensional stage is moved so that the checkerboard grating on the two-dimensional diffraction plate is moved to the position of image side field of the imaging system to be tested, and the diagonal direction of the square is along the X axis direction or Y axis direction;

(4) Moving the second three-dimensional stage along the X axis direction according to the above mentioned 0, ¼, ½, ¾ and $$\frac{\alpha_i}{2\pi}, \frac{\pi - \alpha_i}{2\pi}, \frac{2\pi - \alpha_i}{2\pi}$$

checkerboard grating period (where $$i = 2, 3 \ldots n, \alpha_i < \pi \text{ and } \alpha_i \neq \frac{\pi}{2}).$$

After each movement, the two-dimensional photoelectric sensor acquires a interferogram $I_{\alpha_i}$, transmits it to the data processing unit, and obtains a total of 3n+1 interferograms. Calculating phase as follows:

$$\begin{bmatrix} 1 & 1 & \ldots & 1 \\ \cos\alpha_2 & \cos 3\alpha_2 & \ldots & \cos(2n-1)\alpha_2 \\ \vdots & \vdots & \vdots & \vdots \\ \cos\alpha_n & \cos 3\alpha_n & \ldots & \cos(2n-1)\alpha_n \end{bmatrix} \quad (1)$$

$$\begin{bmatrix} 2a_1\cos\varphi \\ 2a_3(\cos\varphi_3 + \cos\varphi_{3}) \\ \vdots \\ 2a_{2n-1}(\cos\varphi_{2n-1} + \cos\varphi_{-(2n-1)}) \end{bmatrix} = \begin{bmatrix} I_0 - I_\pi \\ I_{\alpha_2} - I_{\pi-\alpha_2} \\ \vdots \\ I_{\alpha_n} - I_{\pi-\alpha_n} \end{bmatrix}$$

$$\begin{bmatrix} \sin\frac{\pi}{2} & \sin\frac{3\pi}{2} & \ldots & \sin\frac{(2n-1)\pi}{2} \\ \sin\alpha_2 & \sin 3\alpha_2 & \ldots & \sin(2n-1)\alpha_2 \\ \vdots & \vdots & \vdots & \vdots \\ \sin\alpha_n & \sin 3\alpha_n & \ldots & \sin(2n-1)\alpha_n \end{bmatrix} \quad (2)$$

$$\begin{bmatrix} 2a_1\sin\varphi \\ 2a_3(\sin\varphi_3 - \sin\varphi_3) \\ \vdots \\ 2a_{2n-1}(\sin\varphi_{2n-1} + \sin\varphi_{-(2n-1)}) \end{bmatrix} = \begin{bmatrix} I_{\frac{\pi}{2}} - I_{\frac{3\pi}{2}} \\ I_{\alpha_2} - I_{2\pi-\alpha_2} \\ \vdots \\ I_{\alpha_n} - I_{2\pi-\alpha_n} \end{bmatrix}$$

By solving linear equations (1) and (2), $2a_1 \cos\varphi$ and $2a_1 \sin\varphi$ are obtained, respectively, and the gradient phase of the X axis direction is obtained:

$$\varphi_x = \arctan\left(\frac{2a_1\sin\varphi}{2a_1\cos\varphi}\right) \quad (3)$$

(5) The first three-dimensional stage is moved so that the second grating along the X axis direction of the grating line on the one-dimensional grating diffraction plate is moved to the position of object side field of the optical imaging system to be tested; performing the same movement of the second three-dimensional stage along the Y axis direction. After each movement, the two-dimensional photoelectric sensor acquires a interferogram $I_{\alpha_i}$, transmits it to the data processing unit, and obtains a total of 3n+1 shearing interferograms. Also calculate $2a_1 \cos\varphi$ and $2a_1 \sin\varphi$ according to formula (1) and formula (2) to obtain the gradient phase of the Y axis direction:

$$\phi_y = \arctan\left(\frac{2a_1\sin\varphi}{2a_1\cos\varphi}\right) \quad (4)$$

(6) By unwrapping the gradient phase $\varphi_x$ of the X axis direction and the gradient phase $\varphi_y$ of the Y axis direction, the differential wavefront $\Delta W_x$ of the X axis direction and the differential wavefront $\Delta W_y$ of the Y axis direction are respectively obtained. The wavefront reconstruction algorithm of shearing interference is used to obtain the wavefront aberration of the optical imaging system to be tested.

For the detection method of wavefront aberration for optical imaging system based on grating shearing interferometer of the present invention, the period of the one-dimensional grating on the one-dimensional diffraction grating plate is equal to the period of the checkerboard grating on the two-dimensional diffraction grating plate times the magnification of the optical imaging system to be tested.

The phase-shifting amounts, 0, ¼, ½, ¾ and $$\frac{\alpha_i}{2\pi}, \frac{\pi - \alpha_i}{2\pi}, \frac{2\pi - \alpha_i}{2\pi}$$

times $2\pi$, where $$i = 2, 3 \ldots n, \alpha_i < \pi \text{ and } \alpha_i \neq \frac{\pi}{2}, \alpha_i$$

is an equally spaced distribution or a non-equal interval distribution within [0 $\pi$).

The phase-shifting amounts, 0, ¼, ½, ¾ and $$\frac{\alpha_i}{2\pi}, \frac{\pi - \alpha_i}{2\pi}, \frac{2\pi - \alpha_i}{2\pi}$$

times $2\pi$, where $$i = 2, 3 \ldots n, \alpha_i < \pi \text{ and } \alpha_i \neq \frac{\pi}{2},$$

when $\alpha_i$ is an equally spaced distribution within $$[0\pi), \frac{\alpha_i}{2\pi} \text{ and } \frac{\pi - \alpha_i}{2\pi}$$

coincide, and the actual phase-shifting step number is simplified to 2 (n+1).

The technical effect of the present invention is that the phase shift between the high-order diffraction beams and the 0th-order beam is realized by moving the two-dimensional grating diffraction plate located on the image plane, and the interference of any high diffraction orders can be eliminated by the phase-shifting algorithm. The precise phase retrieval is achieved, and the detection accuracy of the wavefront aberration of the optical imaging system to be tested is improved.

Figure 1:
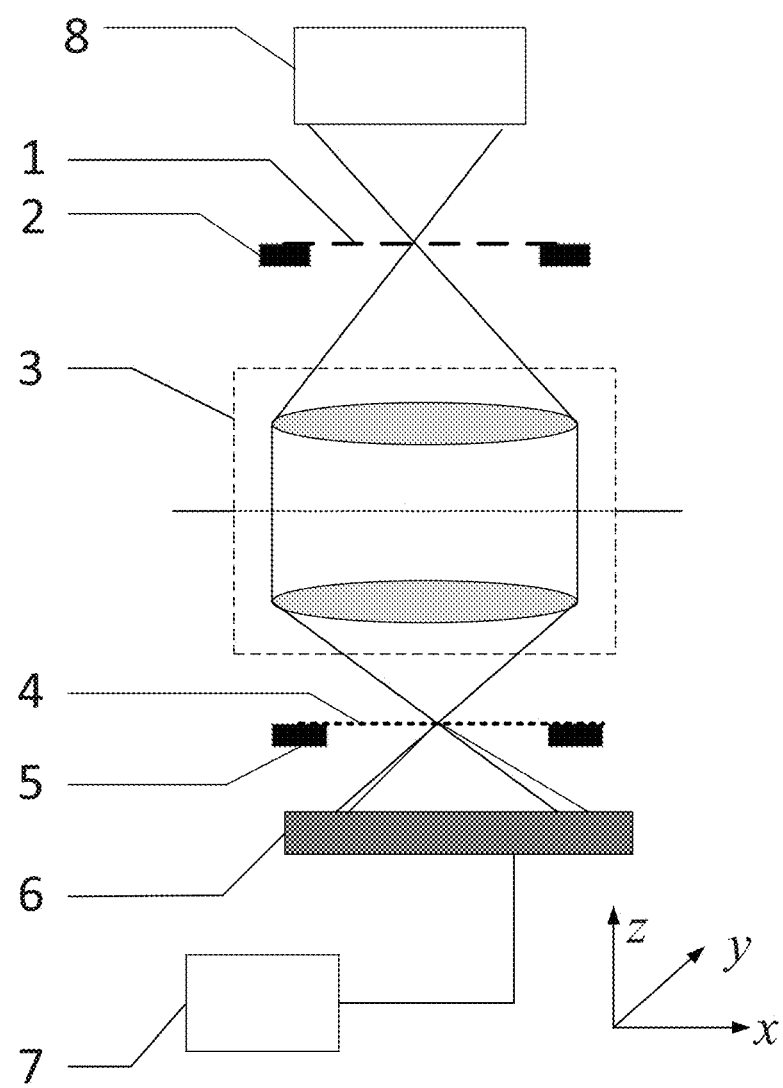
FIG. 1 is a schematic drawing of the detection device of the wavefront aberration for grating shearing interferometer of the present invention.

Reference numbers used in the drawings are as follows: 1—one-dimensional diffraction grating plate; 2—first three-dimensional stage; 3—the optical imaging system to be tested; 4—two-dimensional diffraction grating plate; 5—second three-dimensional stage; 6—two-dimensional photoelectric sensor; 7—computing unit; 8—light source and illumination system.

DETAILED DESCRIPTIONS OF THE INVENTION AND EMBODIMENTS

In combination with the figures and the embodiments hereunder, the present invention is described in detail, while the protection scope of the present invention is not limited to the figures and the embodiment.

As shown in FIG. 1, the grating shearing interferometer system used by the detection method of wavefront aberration for optical imaging system based on grating shearing interferometer disclosed in the present invention comprises a light source and illumination system 8, a one-dimensional diffraction grating plate 1, a first three-dimensional stage 2, a two-dimensional diffraction grating plate 4, a second three-dimensional stage 5, a two-dimensional photoelectric sensor 6 and a computing unit 7. The light source and the illumination system 8 output spatially incoherent light, the one-dimensional diffraction grating plate 1 is fixed on the first three-dimensional stage 2, the two-dimensional diffraction grating plate 4 is fixed on the second three-dimensional stage 5, and the output of the two-dimensional photoelectric sensor 6 is connected with the computing unit 7.

In the system of the present invention, the xyz coordinate is established as follows: the Z axis direction of the coordinate is along the optical axis direction of the system, the X axis direction of the coordinate is along the grating line direction of the linear grating 102 on the one-dimensional diffraction grating plate 1, the Y axis direction of the coordinate is along the grating line direction of the linear grating 101 on the one-dimensional diffraction grating plate 1, and set the motion axes of the first three-dimensional stage 2 and the second three-dimensional stage 5 as X axis, Y axis and Z axis, respectively.

The first three-dimensional stage 2 is used to move the first grating 101 and the second grating 102 on the first diffraction plate 1 to the center of the object side view of the optical imaging system to be tested 3.

The second three-dimensional stage 5 is used to move the checkerboard grating on the second diffraction plate 4 to the center of the image side view of the optical imaging system to be tested 3, and perform specific movement along X axis direction and Y axis direction of the two-dimensional diffraction grating plate 4.

The two-dimensional photoelectric sensor 6 is a charge coupled device CCD or a CMOS sensor, and the detecting surface receives shearing interference fringes generated by diffraction orders of the checkerboard grating.

The computing unit 7 is used to collect and store interferograms, and perform process and analyze of the interferograms.

Figure 2:
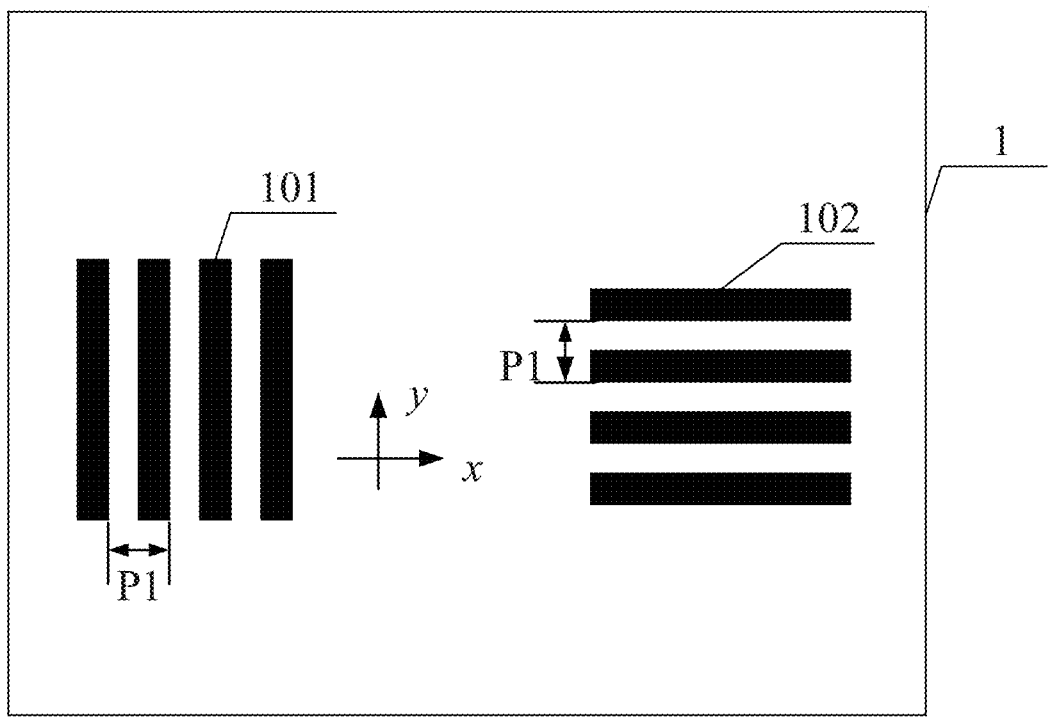
FIG. 2 is a schematic drawing of the one-dimensional diffraction grating plate in the present invention.

As shown in FIG. 2, the one-dimensional diffraction grating plate 1 in the present invention includes two linear diffraction gratings, which are the first grating 101 along Y axis direction of the grating line and the second grating 102 along X axis direction of the grating line, respectively. The period of the linear diffraction grating is P1, and the duty-cycle is 50%.

In the present invention, the first grating 101 and the second grating 102 are phase gratings or amplitude gratings.

Figure 3:
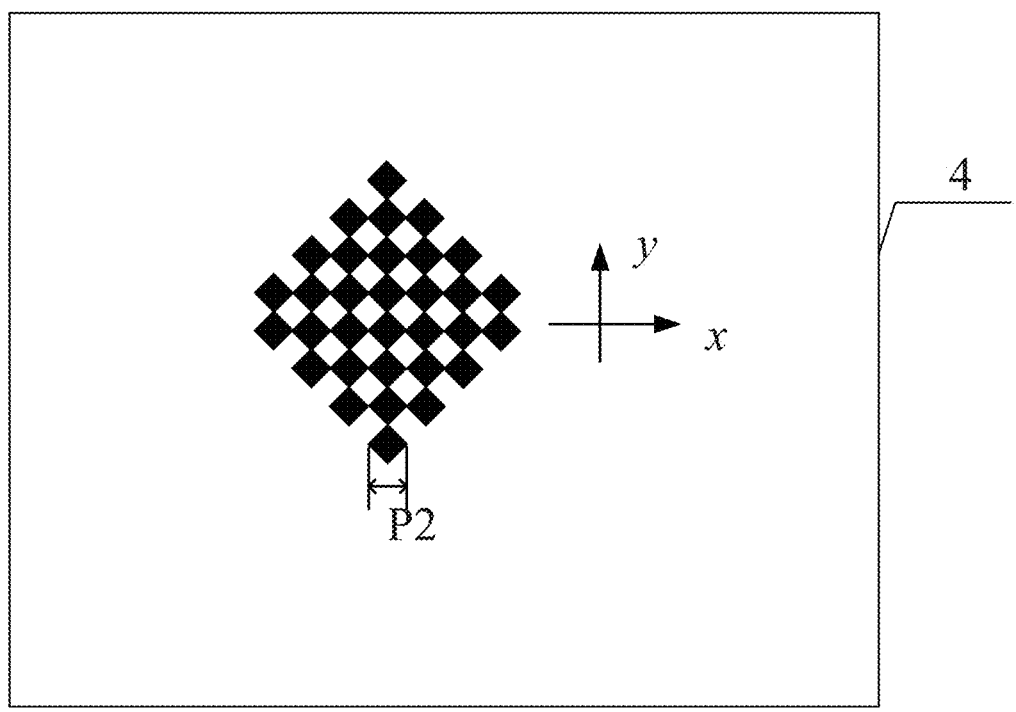
FIG. 3 is a schematic drawing of the two-dimensional diffraction grating plate in the present invention.

As shown in FIG. 3, the two-dimensional diffraction grating plate 4 of the present invention is a checkerboard grating with a period of P2 and a 50% duty-cycle. The checkerboard grating is composed of square grids, and the diagonal direction of the square is along the X axis direction or Y axis direction.

The checkerboard grating is a phase grating or an amplitude grating.

The period of the linear grating P1 and the period of the checkerboard grating P2 satisfy the following formula:

$$P1 = M \cdot P2 \quad (1),$$

wherein M is a magnification of the imaging optical imaging system to be tested 3.

Figure 4:
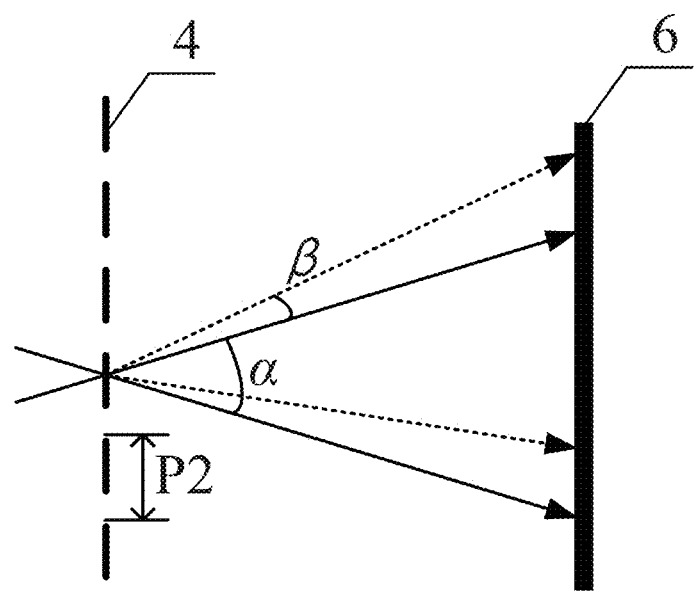
FIG. 4 is a schematic drawing showing the relationship between the shear ratio s of the grating shearing interferometer system and the numerical aperture N.A in the present invention.

As shown in FIG. 4, the relationship between the shear ratio s of the shearing interferometer system, the numerical aperture NA of the optical imaging system to be tested 3, and the period of the checkerboard grating P2 are as follows. The shear ratio s is defined as the ratio of the diffraction angle to the angle with full aperture:

$$s = \frac{\beta}{\alpha} = \frac{\arcsin\left(\frac{\lambda}{P2}\right)}{2ars\sin(NA)} \quad (2)$$

Where, $\beta$ is the diffraction angle of the 1st-order diffraction beam, and $\alpha$ is the angle with full aperture of the beam.

Based on the grating shearing interference system described above, only high-order diffraction wavefront with odd-order is generated after passing through the checkerboard grating of the two-dimensional grating diffraction plate 4. Combining with the linear grating 101 or 102 on the object side of the one-dimensional grating diffraction plate 1, the spatial coherence of the light field is modulated such that there is only interference between the 0th-order beam and other high diffraction orders in the light field, and there is no interference between these high diffraction orders. The interference field received by the two-dimensional photoelectric sensor 6 can then be described as:

$$I(x, y) = A_0^2 + \sum_{m=-(2n+1)}^{m=2n+1} A_n^2 + \cdots +$$
$$2 \sum_{m=-(2n+1)}^{m=2n+1} A_0 A_m \gamma_m \cos[\phi(x, y) - \phi(x - m\Delta, y) - \alpha_m],$$
$$(n = 0, 1, 2, \cdots )$$

wherein $A_0$ is the amplitude of the 0th-order beam, $A_m$ is the amplitude of the mth-order diffraction beam, $\alpha_m$ is the optical path difference between the mth-order diffraction beam and the 0th-order beam, $\phi_{(x, y)}$ is the wavefront to be measured, $\gamma_m$ is the degree of coherence between the m-order diffraction beam and the 0th-order beam, m is the diffraction order, and $\Delta$ is the offset of the 1st-order diffraction beam relative to the 0th-order beam.

Assuming $A_0$ is 1, the $A_m$ and $\gamma_m$ coefficients satisfy the following relationship:

$$A_m = \gamma_m = \frac{2}{m\pi} \quad (4)$$

For small shear conditions, the phase between ±1th order beams and 0th-order beam is as follows:

$$\cos[\phi(x,y) - \phi(x-\Delta,y)] + \cos[\phi(x,y) - \phi(x+\Delta,y)] \approx 2\cos(d\varphi \cdot \Delta)$$

Let $d\varphi \cdot \Delta = \varphi$, $\varphi_m = \phi(x,y) - \phi(x+m\Delta,y)$, then formula (3) can be further simplified as:

$$I = I0 + a_1 \cos\varphi + \sum_{m=3}^{m=2n-1} a_m(\cos\varphi_{-m} + \cos\varphi_m), (n = 2, 3 \ldots) \quad (5)$$

Where, $$I0 = A_0^2 + \sum_{m=-(2n+1)}^{m=2n+1} A_n^2,$$

$$a_1 = 4A_0 A_1 \gamma_1,$$

$$a_m = 2A_0 A_m r_m.$$

When a phase shift $\delta$ is introduced, the above equation can be described as:

$$I = I0 + a_1 \cos(\phi + \delta) + \sum_{m=3}^{m=2n-1} a_m(\cos(\phi_{-m} - m\delta) + \cos(\phi_m + m\delta)) \quad (6)$$

The detection method of wavefront aberration for optical imaging system using the above described grating shearing interference includes the following steps:

(1) The optical imaging system to be tested 3 is placed in the grating shearing interferometer, the light source and the illumination system 8 are located on the object side of the optical imaging system to be tested 3, and the two-dimensional diffraction grating plate 4 is located on the image side of the optical imaging system to be tested 3; the first three-dimensional stage 2 is adjusted so that the one-dimensional diffraction grating plate 1 is located on the object plane of the imaging system to be tested 3; the second three-dimensional stage 5 is adjusted so that the two-dimensional diffraction grating plate 4 is located on the object plane of the imaging system to be tested 3.

(2) The phase-shifting amounts and the moving distance are determined according to the shear ratio s of the grating shearing interferometer: first, the maximum diffraction order is determined as $$m = \text{ceil}\left(\frac{1}{s}\right) - 1,$$

and the diffraction order of the grating shearing interferometer system is in turn as follows: ±1, ±3, ..., ±(2n−1), where n is the number of positive high-order diffraction beams or the negative high-order diffraction beams included in the shearing interferometer system in the grating shear interferometer, $$n = \text{fix}\left(\frac{m+1}{2}\right),$$

the function ceil(X) returns the smallest integer greater than or equal to X, and the function fix(X) returns the biggest integer less than or equal to X; then, according to n, a movement of the two-dimensional diffraction grating plate (4) when the interferogram is acquired is respectively determined as 0, ¼, ½, ¾ and $$\frac{\alpha_i}{2\pi}, \frac{\pi - \alpha_i}{2\pi}, \frac{2\pi - \alpha_i}{2\pi}$$

checkerboard grating period (where $$i = 2, 3 \ldots n, \alpha_i < \pi \text{ and } \alpha_i \neq \frac{\pi}{2}),$$

and has a total of 3n+1 step number.

(3) The first three-dimensional stage 2 is moved so that the first grating 101 along the Y axis direction of the grating line on the one-dimensional grating diffraction plate 1 is moved into the position of object side field of the optical imaging system to be tested 3; the second three-dimensional stage 5 is moved so that the checkerboard grating on the two-dimensional diffraction plate 4 is moved into the position of image side field of the imaging system to be tested 3, and the diagonal direction of the square is along the X axis direction or Y axis direction.

(4) Moving the second three-dimensional stage 5 along the X axis direction according to the above mentioned 0, ¼, ½, ¾ and $$\frac{\alpha_i}{2\pi}, \frac{\pi - \alpha_i}{2\pi}, \frac{2\pi - \alpha_i}{2\pi}$$

checkerboard grating period (where $$i = 2, 3 \ldots n, \alpha_i < \pi \text{ and } \alpha_i \neq \frac{\pi}{2}).$$

After each movement, the two-dimensional photoelectric sensor 6 acquires a interferogram $I_{\alpha_i}$, transmits it to the data processing unit 7, and obtains a total of 3n+1 interferograms. Calculating phase as follows:

$$\begin{bmatrix} 1 & 1 & \ldots & 1 \\ \cos\alpha_2 & \cos 3\alpha_2 & \ldots & \cos(2n-1)\alpha_2 \\ \vdots & \vdots & \vdots & \vdots \\ \cos\alpha_n & \cos 3\alpha_n & \ldots & \cos(2n-1)\alpha_n \end{bmatrix}. \quad (7)$$

$$\begin{bmatrix} 2a_1\cos\varphi \\ 2a_3(\cos\varphi_3 + \cos\varphi_{-3}) \\ \vdots \\ 2a_{2n-1}(\cos\varphi_{2n-1} + \cos\varphi_{-(2n-1)}) \end{bmatrix} = \begin{bmatrix} I_0 - I_\pi \\ I_{\alpha_2} - I_{\pi-\alpha_2} \\ \vdots \\ I_{\alpha_n} - I_{\pi-\alpha_n} \end{bmatrix}$$

$$\begin{bmatrix} \sin\frac{\pi}{2} & \sin\frac{3\pi}{2} & \ldots & \sin\frac{(2n-1)\pi}{2} \\ \sin\alpha_2 & \sin 3\alpha_2 & \ldots & \sin(2n-1)\alpha_2 \\ \vdots & \vdots & \vdots & \vdots \\ \sin\alpha_n & \sin 3\alpha_n & \ldots & \sin(2n-1)\alpha_n \end{bmatrix}. \quad (8)$$

$$\begin{bmatrix} 2a_1\sin\varphi \\ 2a_3(\sin\varphi_3 - \sin\varphi_{-3}) \\ \vdots \\ 2a_{2n-1}(\sin\varphi_{2n-1} + \sin\varphi_{-(2n-1)}) \end{bmatrix} = \begin{bmatrix} I_{\frac{\pi}{2}} - I_{\frac{3\pi}{2}} \\ I_{\alpha_2} - I_{2\pi-\alpha_2} \\ \vdots \\ I_{\alpha_n} - I_{2\pi-\alpha_n} \end{bmatrix}$$

By solving linear equations (1) and (2), $2a_1 \cos \varphi$ and $2a_1 \sin \varphi$ are obtained, respectively, and the gradient phase of the X axis direction is obtained:

$$\varphi_x = \arctan\left(\frac{2a_1\sin\varphi}{2a_1\cos\varphi}\right). \quad (9)$$

(5) The first three-dimensional stage 2 is moved so that the second grating 102 along the X axis direction of the grating line on the one-dimensional grating diffraction plate 1 is moved to the position of object side field of the optical imaging system to be tested 3; performing the same movement of the second three-dimensional stage 5 along the Y axis direction. After each movement, the two-dimensional photoelectric sensor 6 acquires a interferogram $I_{\alpha_i}$, transmits it to the data processing unit 7, and obtains a total of 3n+1 interferograms. Also calculate $2a_1 \cos \varphi$ and $2a_1 \sin \varphi$ according to formula (7) and formula (8) to obtain the gradient phase of the Y axis direction:

$$\varphi_y = \arctan\left(\frac{2a_1\sin\varphi}{2a_1\cos\varphi}\right). \quad (10)$$

(6) By unwrapping the gradient phase $\varphi_x$ of the X axis direction and the gradient phase $\varphi_y$ of the Y axis direction, the differential wavefront $\Delta W_x$ of the X axis direction and the differential wavefront $\Delta W_y$ of the Y axis direction are respectively obtained. The wavefront reconstruction algorithm of shearing interference is used to obtain the wavefront aberration of the optical imaging system to be tested.

The phase-shifting amounts 0, ¼, ½, ¾ and $$\frac{\alpha_i}{2\pi}, \frac{\pi - \alpha_i}{2\pi}, \frac{2\pi - \alpha_i}{2\pi}$$

times $2\pi$, where $$i = 2, 3 \ldots n, \alpha_i < \pi \text{ and } \alpha_i \neq \frac{\pi}{2}, \alpha_i$$

is an equally spaced distribution or a non-equal interval distribution within [0 $\pi$).

The phase-shifting amounts 0, ¼, ½, ¾ and $$\frac{\alpha_i}{2\pi}, \frac{\pi-\alpha_i}{2\pi}, \frac{2\pi-\alpha_i}{2\pi}$$

times $2\pi$, where $$i = 2, 3 \ldots n, \alpha_i < \pi \text{ and } \alpha_i \neq \frac{\pi}{2},$$

when $\alpha_i$ is an equally spaced distribution within $$[0\pi), \frac{\alpha_i}{2\pi} \text{ and } \frac{\pi-\alpha_i}{2\pi}$$

overlap, and the actual phase-shifting step number is simplified to 2 (n+1).

An embodiment of the phase-shifting amounts setting of the present invention is given below.

Assuming that the shear ratio s of the grating shearing interferometer system is 2%, there are high diffraction orders such as ±3th-, ±5th- . . . and ±49th-order beams in the interference field.

When $\alpha_i$ is a non-equal interval distribution within [0 π), the exact solution of the equation requires a 76-step phase shift, and the phase-shifting amounts can be set to:

$$0, \frac{n}{M}\frac{\pi}{2}, \frac{\pi}{2}, \pi - \frac{n}{M}\frac{\pi}{2}, 2\pi - \frac{n}{M}\frac{\pi}{2},$$

where M=25, n=1,2 . . . M−1; and there can be other forms of phase-shifting distribution.

In particular, when $\alpha_i$ is an equally spaced distribution within [0 π), the phase shifts in the first quadrant and the second quadrant coincide, the actual phase-shifting step number is reduced by 24, the exact solution of the equation requires a 52-step phase shift, and the phase-shifting distribution is:

$$0, \frac{N}{M}\frac{\pi}{2}, \pi/2, \pi - \frac{N}{M}\frac{\pi}{2}, \pi, \pi + \frac{N}{M}\frac{\pi}{2}, 3\pi/2, 2\pi - \frac{N}{M}\frac{\pi}{2},$$

where M=13, N=1, 2, 3 . . . M−1. That is, the phase-shifting amounts is equally spaced within [0 2π) period, the interval of the phase shift is $$\frac{\pi}{26},$$

corresponding to the checkerboard grating of the image plane moves 52 times in a period, and the moving interval of each move is $$\frac{1}{52}$$

checkerboard grating period.

The method of the present invention has the advantages of high precision, large measurable range of numerical aperture, and adjustable shear ratio of the grating interferometer.

We claim:

1. A method for detecting wavefront aberration for optical imaging system based on grating shearing interferometer, comprising
   (1) placing an optical imaging system to be tested (3) in a grating shearing interferometer, a light source and illumination system (8) and a one-dimensional diffraction grating plate (1) are located on an object side of the optical imaging system to be tested (3), and a two-dimensional diffraction grating plate (4) is located on an image side of the optical imaging system to be tested (3); a first three-dimensional stage (2) is adjusted so that a one-dimensional diffraction grating plate (1) is located on an object plane of the imaging system to be tested (3); a second three-dimensional stage (5) is adjusted so that the two-dimensional diffraction grating plate (4) is located on the object plane of the imaging system to be tested (3);
   (2) determining the phase-shifting amounts according to a shear ratio s of the grating shearing interferometer by firstly determining a maximum diffraction order as $$m = \text{ceil}\left(\frac{1}{s}\right) - 1,$$

and a diffraction order of the grating shearing interferometer system is in turn as follows: ±1, ±3, . . . , ±(2n−1), wherein n is a total amount of positive high-order or a negative high-order in the grating shearing interferometer system, $$n = \text{fix}\left(\frac{m+1}{2}\right),$$

function ceil(X) returns a smallest integer greater than or equal to X, and function fix(X) returns a biggest integer less than or equal to X; then, according to n, a movement of the two-dimensional diffraction grating plate (4) when the interferogram is acquired is respectively determined as 0, ¼, ½, ¾ and $$\frac{\alpha_i}{2\pi}, \frac{\pi-\alpha_i}{2\pi}, \frac{2\pi-\alpha_i}{2\pi}$$

checkerboard grating period, wherein $$i = 2, 3 \ldots n, \alpha_i < \pi \text{ and } \alpha_i \neq \frac{\pi}{2};$$

(3) moving the first three-dimensional stage (2) so that a first grating (101) along an Y axis direction of a grating line on the one-dimensional grating diffraction plate (1) is moved to a position in a field of the object side of the optical imaging system to be tested (3); moving the second three-dimensional stage (5) so that a checkerboard grating on the two-dimensional diffraction plate (4) is moved to a position in a field of the image side of the imaging system to be tested (3), and the diagonal direction of the square is along the X axis direction or Y axis direction;

(4) moving the second three-dimensional stage (5) along the X axis direction according to the 0, ¼, ½, ¾ and $$\frac{\alpha_i}{2\pi}, \frac{\pi - \alpha_i}{2\pi}, \frac{2\pi - \alpha_i}{2\pi}$$

checkerboard grating period, wherein $$i = 2, 3 \ldots n, \alpha_i < \pi \text{ and } \alpha_i \neq \frac{\pi}{2};$$

after each movement, having a two-dimensional photoelectric sensor (6) to acquire a interferogram $I_{\alpha_i}$, transmitting the interferogram $I_{\alpha_i}$ to a data processing unit (7), and obtaining a total of 3n+1 interferograms, wherein phase is calculated as follows:

$$\begin{bmatrix} 1 & 1 & \ldots & 1 \\ \cos\alpha_2 & \cos3\alpha_2 & \ldots & \cos(2n-1)\alpha_2 \\ \vdots & \vdots & \vdots & \vdots \\ \cos\alpha_n & \cos3\alpha_n & \ldots & \cos(2n-1)\alpha_n \end{bmatrix} \quad (1)$$

$$\begin{bmatrix} 2a_1\cos\varphi \\ 2a_3(\cos\varphi_3 + \cos\varphi_{-3}) \\ \vdots \\ 2a_{2n-1}(\cos\varphi_{2n-1} + \cos\varphi_{-(2n-1)}) \end{bmatrix} = \begin{bmatrix} I_0 - I_\pi \\ I_{\alpha_2} - I_{\pi-\alpha_2} \\ \vdots \\ I_{\alpha_n} - I_{\pi-\alpha_n} \end{bmatrix}$$

$$\begin{bmatrix} \sin\frac{\pi}{2} & \sin\frac{3\pi}{2} & \ldots & \sin\frac{(2n-1)\pi}{2} \\ \sin\alpha_2 & \sin3\alpha_2 & \ldots & \sin(2n-1)\alpha_2 \\ \vdots & \vdots & \vdots & \vdots \\ \sin\alpha_n & \sin3\alpha_n & \ldots & \sin(2n-1)\alpha_n \end{bmatrix} \quad (2)$$

$$\begin{bmatrix} 2a_1\sin\varphi \\ 2a_3(\sin\varphi_3 - \sin\varphi_{-3}) \\ \vdots \\ 2a_{2n-1}(\sin\varphi_{2n-1} + \sin\varphi_{-(2n-1)}) \end{bmatrix} = \begin{bmatrix} I_{\frac{\pi}{2}} - I_{\frac{3\pi}{2}} \\ I_{\alpha_2} - I_{2\pi-\alpha_2} \\ \vdots \\ I_{\alpha_n} - I_{2\pi-\alpha_n} \end{bmatrix}$$

obtaining $2a_1 \cos \varphi$ and $2a_1 \sin \varphi$ by solving linear equations (1) and (2), respectively, and obtaining a gradient phase of the X axis direction $\varphi_x$ as follows:

$$\varphi_x = \arctan\left(\frac{2a_1\sin\varphi}{2a_1\cos\varphi}\right); \quad (3)$$

(5) moving the first three-dimensional stage (2) so that a second grating (102) along the X axis direction of a grating line on the one-dimensional grating diffraction plate (1) is moved to a position in a field of the object side of the optical imaging system to be tested (3); performing same periodic movement of the second three-dimensional stage (5) along the Y axis direction; after each movement, having the two-dimensional photoelectric sensor (6) to acquire a interferogram $I_{\alpha_i}$, transmitting the shearing interferogram $I_{\alpha_i}$ to the data processing unit (7), and obtaining a total of 3n+1 interferograms; calculating $2a_1 \cos \varphi$ and $2a_1 \sin \varphi$ according to formula (1) and formula (2) to obtain a gradient phase of the Y axis direction $\varphi_y$ as follows:

$$\varphi_y = \arctan\left(\frac{2a_1\sin\varphi}{2a_1\cos\varphi}\right); \quad (4)$$

and (6) unwrapping the gradient phase $\varphi_x$ of the X axis direction and the gradient phase $\varphi_y$ of the Y axis direction, and obtaining a differential wavefront $\Delta W_x$ of the X axis direction and a differential wavefront $\Delta W_y$ of the Y axis direction, respectively; using a wavefront reconstruction algorithm of shearing interference to obtain a wavefront aberration W of the optical imaging system to be tested (3), wherein the grating shearing interferometer comprises the light source and illumination system (8),
the one-dimensional diffraction grating plate (1),
the first three-dimensional stage (2),
the two-dimensional diffraction grating plate (4),
the second three-dimensional stage (5),
the two-dimensional photoelectric sensor (6), and
the computing unit (7), wherein the light source and illumination system (8) outputs spatially incoherent light, the one-dimensional diffraction grating plate (1) is fixed on the first three-dimensional stage (2), the two-dimensional diffraction grating plate (4) is fixed on the second three-dimensional stage (5), the one-dimensional diffraction grating plate (1) comprises two sets of linear gratings with 50% duty-cycle, the two-dimensional diffraction grating plate (4) comprises a set of checkerboard gratings, an output of the two-dimensional photoelectric sensor (6) is connected with the computing unit (7);

an xyz coordinate is established as follows: Z axis direction of the xyz coordinate is along an optical axis direction of the grating shearing interferometer, the X axis direction of the xyz coordinate is along the grating line direction of the linear grating (102) on the one-dimensional diffraction grating plate (1), the Y axis direction of the xyz coordinate is along the grating line direction of the linear grating (101) on the one-dimensional diffraction grating plate (1), and set motion axes of the first three-dimensional stage (2) and the second three-dimensional stage (5) as the X axis, the Y axis, and the Z axis, respectively, and the period of the one-dimensional grating on the one-dimensional diffraction grating plate (1) is equal to the period of the checkerboard grating on the two-dimensional diffraction grating plate (4) times a magnification of the optical imaging system to be tested (3).

2. The method of claim 1, wherein in the phase-shifting amounts, 0, ¼, ½, ¾ and $$\frac{\alpha_i}{2\pi}, \frac{\pi - \alpha_i}{2\pi}, \frac{2\pi - \alpha_i}{2\pi}$$

times 2π, i=2, 3 . . . n, $$\alpha_i < \pi \text{ and } \alpha_i \neq \frac{\pi}{2},$$

and $\alpha_i$ is an equally spaced distribution or a non-equal interval distribution within [0 $\pi$).

3. The method of claim 1, wherein in the phase-shifting amounts, 0, ¼, ½, ¾ and $$\frac{\alpha_i}{2\pi}, \frac{\pi - \alpha_i}{2\pi}, \frac{2\pi - \alpha_i}{2\pi}$$

times $2\pi$, i=2, 3 . . . n, $$\alpha_i < \pi \text{ and } \alpha_i \neq \frac{\pi}{2},$$

when $\alpha_i$ is an equally spaced distribution within [0 $\pi$), the phase-shifting amounts $$\frac{\alpha_i}{2\pi} \text{ and } \frac{\pi - \alpha_i}{2\pi}$$

coincide, and an actual total phase-shifting step number is 2(n+1).

* * * * *